United States Patent
Hellwig et al.

(10) Patent No.: US 9,063,187 B2
(45) Date of Patent: Jun. 23, 2015

(54) HALL SENSOR ELEMENT AND METHOD FOR MEASURING A MAGNETIC FIELD

(75) Inventors: Wolfgang Hellwig, Gomaringen (DE); Friedemann Eberhardt, Reutlingen (DE); Valentin von Tils, Nehren (DE); Stefan Ruebenacke, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 477 days.

(21) Appl. No.: 13/381,505

(22) PCT Filed: Apr. 30, 2010

(86) PCT No.: PCT/EP2010/055904
§ 371 (c)(1),
(2), (4) Date: Mar. 26, 2012

(87) PCT Pub. No.: WO2011/000601
PCT Pub. Date: Jan. 6, 2011

(65) Prior Publication Data
US 2012/0169329 A1    Jul. 5, 2012

(30) Foreign Application Priority Data
Jun. 30, 2009  (DE) .......................... 10 2009 027 338

(51) Int. Cl.
*G01R 33/06* (2006.01)
*H01L 43/06* (2006.01)
*G01R 33/07* (2006.01)

(52) U.S. Cl.
CPC .............. *G01R 33/07* (2013.01); *G01R 33/075* (2013.01); *H01L 43/065* (2013.01)

(58) Field of Classification Search
CPC ... H01L 2924/00; H01L 43/065; H01L 43/06; H01L 43/04; H01L 43/14; H01L 21/8258; G01R 33/07; G01R 33/075; G01R 33/077; G01R 15/202; G01R 31/3004
USPC ................. 324/251, 207.2, 202, 207.21, 252, 324/117 H; 257/E43.003, E27.005, 421–427
See application file for complete search history.

(56) References Cited

U.S. PATENT DOCUMENTS

| 4,829,352 A | * | 5/1989 | Popovic et al. ................ 257/426 |
| 5,146,201 A | * | 9/1992 | Kimura et al. .............. 338/32 H |

(Continued)

FOREIGN PATENT DOCUMENTS

| DE | 10 2006 017 910 | 10/2007 |
| JP | 2006-210731 | 8/2006 |
| JP | 2008-185406 | 8/2008 |

OTHER PUBLICATIONS

C.Scott et al., CMOS Single-Chip Electronic Compass with Microcontroller, in : H.Casier et al. [eds.], Analog Circuit Design : Sensors, Actuators and Power Drivers ; Integrated Power Aplifiers from Wireline to RF ; Very High Frequency Front Ends, pp. 55-69, Springer Science + Business Media B.V., 2008.

*Primary Examiner* — Arleen M Vazquez
*Assistant Examiner* — Neel Shah
(74) *Attorney, Agent, or Firm* — Kenyon & Kenyon LLP

(57) ABSTRACT

The invention provides a Hall sensor element having a substrate, which has a main surface, having an electrically conductive active region, which extends from the main surface into the substrate, and having a first electrically conductive, buried layer in the substrate, which contacts the active region at a first lower contact surface. From another standpoint, the invention provides a method for measuring a magnetic field with the aid of such a Hall sensor element, in which an electrical measuring current is conducted through the active region between a first upper contact electrode at the main surface and the first lower contact surface. A Hall voltage is picked up in the active region along a path running inclined with respect to a connecting line between the first lower contact surface and the first upper contact electrode. Alternatively, a measuring current is conducted through the active region over such a path, and a Hall voltage is picked up between the first upper contact electrode and the first lower contact surface.

12 Claims, 9 Drawing Sheets

(56) References Cited

U.S. PATENT DOCUMENTS

| | | | |
|---|---|---|---|
| 5,572,058 A * | 11/1996 | Biard | 257/421 |
| 6,278,271 B1 * | 8/2001 | Schott | 324/251 |
| 2009/0256559 A1 * | 10/2009 | Ausserlechner et al. | 324/251 |
| 2010/0097059 A1 * | 4/2010 | Estrada et al. | 324/251 |
| 2010/0219821 A1 * | 9/2010 | Rocznik et al. | 324/251 |

* cited by examiner (I-I')

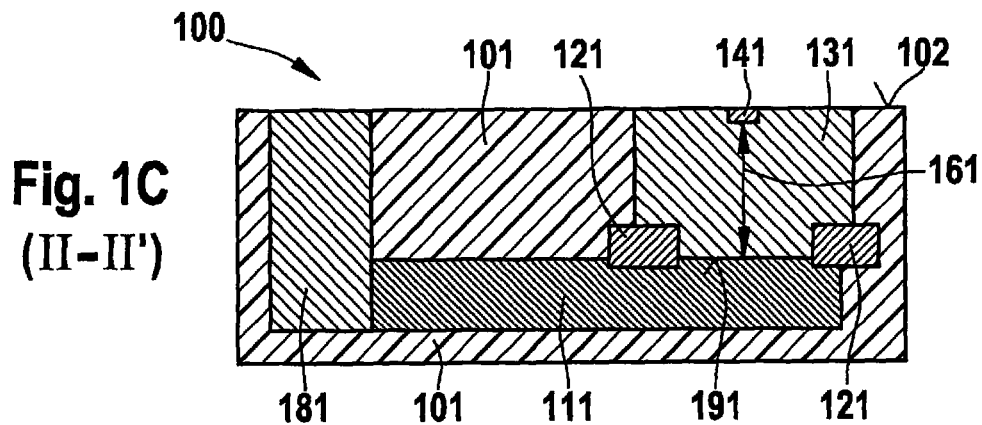
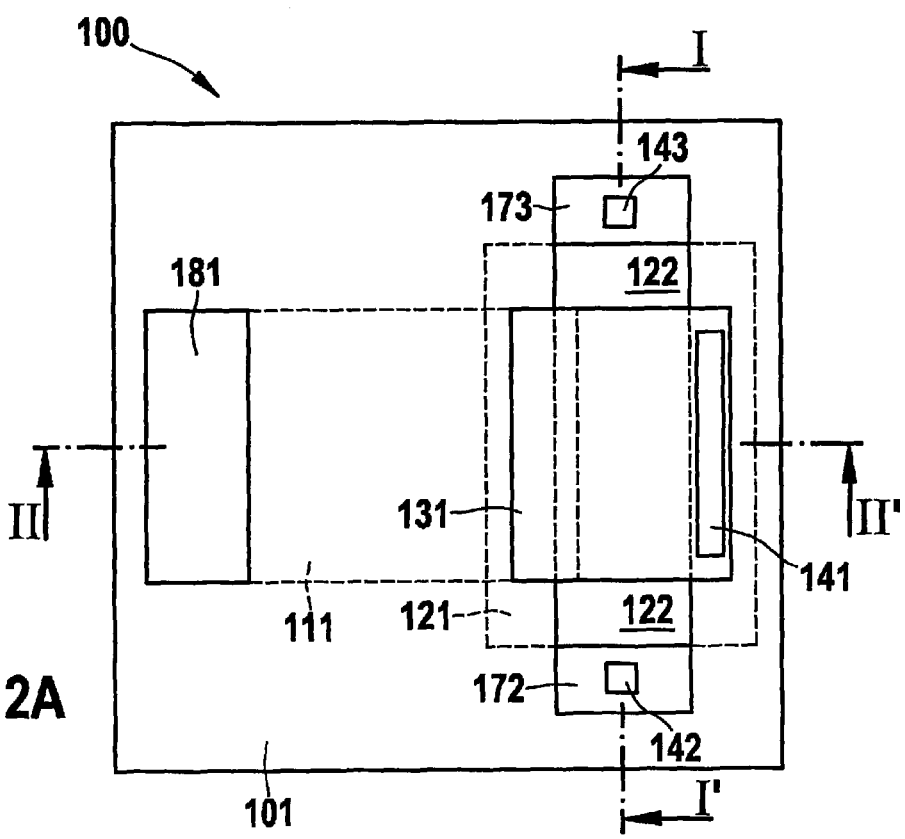

(I-I')

(II-II')

(I-I')

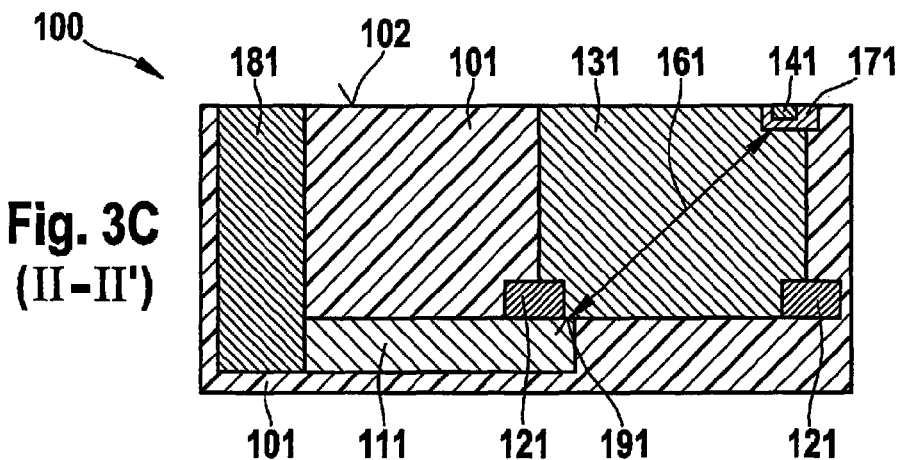
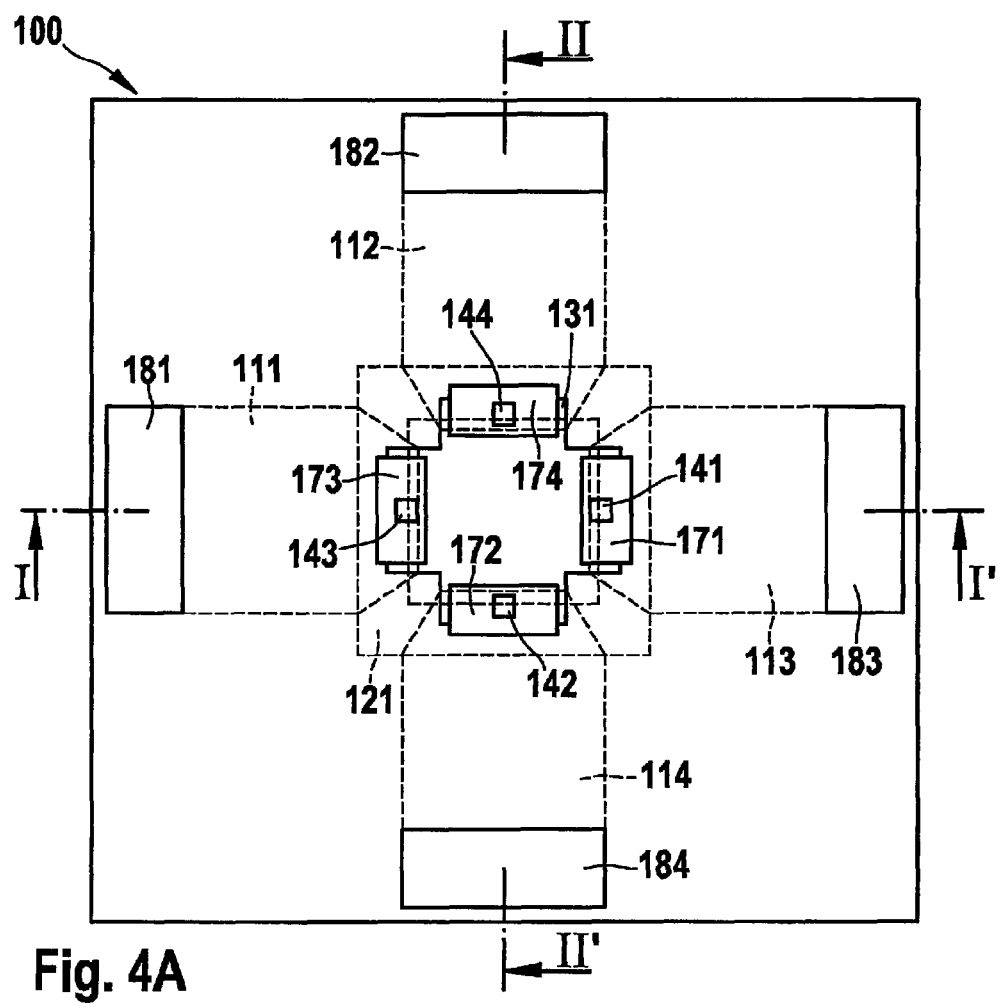

(I-I')

(II-II')

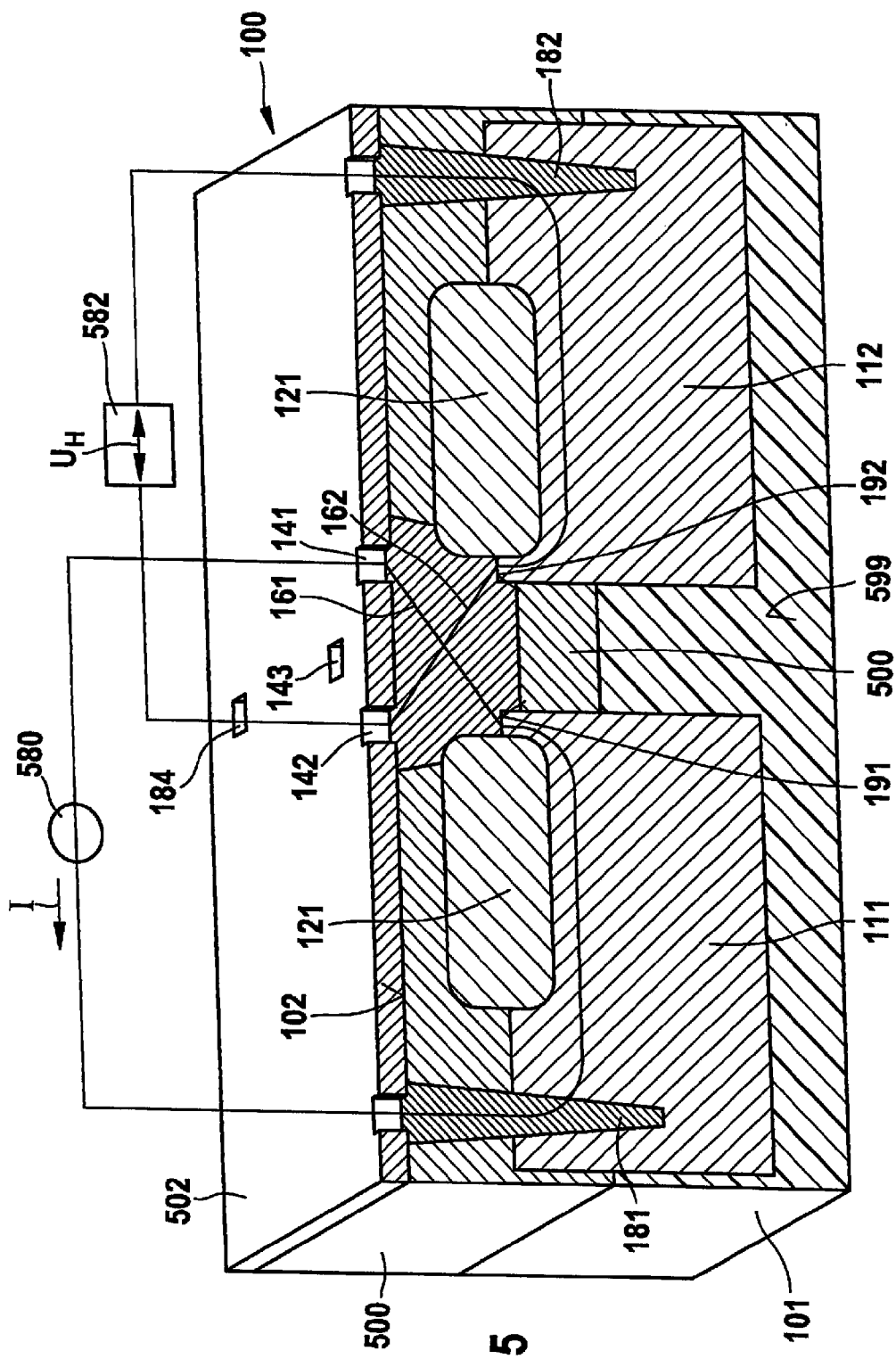

HALL SENSOR ELEMENT AND METHOD FOR MEASURING A MAGNETIC FIELD

FIELD OF THE INVENTION

The present invention relates to a Hall sensor element having a substrate with a main surface. Furthermore, the present invention relates to methods for measuring, in particular multidimensional measuring, of a magnetic field with the aid of such a Hall sensor element.

BACKGROUND INFORMATION

Hall sensor elements based on the Hall effect are used in wide areas of technology for measuring the magnetic flux density of magnetic fields and also for contactless measurement of currents as well as contactless transducers, e.g., for wear-free detection of the position of shafts, actuators and the like. A Hall sensor element is generally composed of a semiconductor substrate wafer having four contact terminals for electrical connection to an external trigger circuit. Of the four contact terminals, two contact terminals are provided for applying an operating current through an active semiconductor area of the sensor element, while the two other contact terminals are used to detect the Hall voltage. The Hall voltage is perpendicular to the direction of the magnetic flux and of the current flux in the active semiconductor area.

German patent document DE 10 2006 017 910 A1 discusses a so-called horizontal Hall sensor element, in which the operating current and the Hall voltage run horizontally in the plane of the main surface of the semiconductor substrate. Horizontal Hall sensor elements are relatively easy to manufacture using traditional CMOS processes for manufacturing semiconductor structures, sensing flux density components of magnetic fields directed perpendicularly to the plane of the substrate. A multidimensional measurement of magnetic fields such as that required in compass applications, for example, is possible using horizontal Hall sensor elements by positioning multiple discrete semiconductor substrate wafers, on each of which a horizontal Hall sensor element is formed, perpendicular to various spatial directions, but this is associated with high manufacturing costs and space requirements.

German patent document DE 10 2006 017 910 A1 also discusses a vertical Hall sensor element in which the operating current and the Hall voltage run in a plane vertical to the substrate surface, so that flux density components of magnetic fields directed parallel to the plane of the substrate are sensed. The vertical Hall sensor element includes a plurality of contact areas at the main surface of a semiconductor area extending into the substrate. Nonconducting barrier areas extending into the semiconductor area, starting from the main surface, are situated between neighboring contact surfaces to keep an operating current, which is fed between two contact surfaces in the semiconductor area at a distance from the main surface. However, the problem arising here is that the conductivity for the charge carriers in deeper regions of the active semiconductor area is much lower than that at the surface of the semiconductor material, which may be silicon, so that such a vertical Hall sensor element is only marginally efficient.

A structure having multiple horizontal Hall sensor elements on a single semiconductor substrate wafer and an additional structured ferromagnetic layer, which deflects magnetic field components which are parallel to the surface of the semiconductor substrate wafer into local vertical fields, is proposed by C. Schott et al., but requires a high manufacturing effort because the structure cannot be manufactured using traditional processes for manufacturing semiconductor structures (C. Schott et al., CMOS Single-Chip Electronic Compass with Microcontroller, in: H. Casier et al. [eds.], Analog Circuit Design: Sensors, Actuators and Power Drivers; Integrated Power Amplifiers from Wireline to RF; Very High Frequency Front Ends, pages 55-69, Springer Science+Business Media B.V., 2008).

SUMMARY OF THE INVENTION

It is therefore desirable to enable efficient measurement of magnetic field components running horizontally to the plane of the semiconductor substrate wafer with the aid of a structure, which may be manufactured inexpensively on the semiconductor substrate wafer.

Accordingly, a Hall sensor element having a substrate, which has a main surface, is provided. An electrically conductive active region extends from the main surface into the substrate. The Hall sensor element has an electrically conductive first buried layer in the substrate contacting the active region at a first lower contact surface. The term "buried in the substrate" implies that the layer has a property different from the substrate and is situated at a distance from the main surface. In other words, a substrate area which covers the layer is situated between the first buried layer and the main surface. The substrate may continue beneath the buried layer in another substrate area, for example, which may be designed to be the same as or different from the substrate area covering the layer, or the first buried layer is accessible from a rear surface opposite the main surface, for example.

Contacting of the active region from the side of the buried layer makes it possible to provide at least one of the contact terminals of the Hall sensor element in which the operating current is applied and the Hall voltage is picked up at the location of the lower contact surface, i.e., at a position a distance away from the main surface due to the buried position of the buried layer in the substrate. Depending on whether the first lower contact surface is wired for applying the operating current or/and for picking up the Hall voltage, this makes it possible for the flow direction of the operating current or/and the pickup direction of the Hall voltage to run with one directional component vertical to the main surface, between the first lower contact surface and an additional contact terminal, which may be situated on the readily accessible main surface of the semiconductor area, for example. The vertical directional component of the flow direction of the operating current and/or the pickup direction of the Hall voltage means that the measurement plane spanned by the two runs inclined or at a right angle with respect to the main surface of the substrate and the Hall sensor element is sensitive for magnetic fields parallel to the main surface. The Hall sensor element according to the exemplary embodiments and/or exemplary methods of the present invention thus permits an alignment of the measuring planes independently of the position of the main surface, so that with a suitable determination of two or three measuring planes with linearly independent normal vectors, it is possible to use this for two-dimensional or three-dimensional measurement of magnetic fields.

The Hall sensor element according to the present invention makes it possible to apply the operating current essentially in a straight line from the lower contact surface due to the position of the lower contact surface, which is at a distance from the main surface and/or to pick up the Hall voltage in a straight line and operates therefore highly efficiently. In particular it is not necessary to force the flow direction of the operating current in the active range, the pick-up direction of the Hall voltage, or the direction of the field lines into a curved path, which has a negative effect on efficiency.

The Hall sensor element according to the present invention is manufacturable completely using traditional processes for manufacturing semiconductor structures, for example, with the aid of so-called smart power technologies. It is therefore extremely inexpensive and may be integrated advantageously in particular with other Hall sensor elements and/or other power, analog, and digital functions on one chip. Steps which go beyond traditional processes and make the manufacturing more expensive, e.g., the formation of ferromagnetic layers, are not necessary.

According to one refinement, the substrate is a semiconductor substrate and the active region is a semiconductor region of a first type of conductivity. This generates a high Hall voltage, and the Hall sensor element may be tied into existing microelectronic manufacturing methods efficiently and integrated with additional semiconductor functions on the semiconductor substrate.

According to one refinement, the Hall sensor element has a first upper contact electrode, which contacts the active region at the main surface. The contact electrode at the main surface is particularly simple to manufacture and needs little substrate area.

According to one refinement, the first upper contact electrode is situated essentially at a right angle above the first lower contact surface. Thus a particularly small area in the plane of the main surface is needed and at the same time a high sensitivity for magnetic fields running parallel to the main surface is achieved. According to an alternative refinement, the first upper contact electrode is situated diagonally offset to the first lower contact surface. This enables a higher sensitivity for magnetic fields striking the main surface obliquely.

According to one refinement, the Hall sensor element has a second and a third upper contact electrode, each of which contacts the active region at the main surface, so that a total of four contact terminals are formed for operation of the Hall sensor element. At the main surface, the contact electrodes are accessible in a particularly simple manner, so that the Hall sensor element may be wired easily.

According to an alternative refinement, the Hall sensor element has a second electrically conductive buried layer, which contacts the active region at a second lower contact surface, and a second upper contact electrode, which contacts the active region at the main surface. The lower contact surfaces and the upper contact electrodes are situated in such a way that a first connecting line between the first lower contact surface and the first upper contact electrode runs inclined to a second connecting line between the second lower contact surface and the second upper contact electrode. The term "connecting line" is intended here in the sense of a geometric path through the active region, along which electrical current may flow through the active region or a voltage may be picked up. The inclination of the connecting lines to one another makes it possible to use one of the lower contact surfaces and the upper contact electrode of the same number to pick up the Hall voltage symmetrically. The circuit is then easily reversed periodically within the scope of a so-called spinning current method due to the symmetry in order to increase the measuring accuracy.

The Hall sensor element may have third and fourth electrically conductive buried layers, which contact the active region at corresponding third and fourth lower contact surfaces, and also has third and fourth upper contact electrodes, which contact the active region at the main surface. The lower contact surfaces and the upper contact electrodes are situated in such a way that a first plane, which is spanned by the first and second connecting lines, runs inclined to a second plane, which is spanned by a third and a fourth connecting line. The third connecting line connects the third lower contact surface to the third upper contact electrode, while the fourth connecting line connects the fourth lower contact surface to the fourth upper contact surface. Depending on the wiring, which is variable periodically as needed, for example, this makes it possible to measure magnetic field components, which are perpendicular to the first plane, as well as magnetic field components which are perpendicular to the second plane. This is also possible in particular when the second and third buried layers, the second and third lower contact surfaces, the second and third upper contact electrodes and consequently also the second and third connecting lines are each designed to be identical to one another. Spinning current methods may also be used to increase the measuring accuracy within the individual planes.

From an additional standpoint, the exemplary embodiments and/or exemplary methods of the present invention provide a method for measuring a magnetic field with the aid of such a Hall sensor element in which an electrical measuring current is directed between a first upper contact electrode at the main surface and the first lower contact surface through the active region. The term "at the main surface" is understood to refer to a location close to the main surface in comparison with the distance of the first lower contact surface to the main surface. A Hall voltage is picked up in the active region along a path which runs inclined to a connecting line between the first lower contact surface and the first upper contact electrode. This path may run, for example, in an area where it intersects the connecting line, namely at a right angle or at an inclined angle to the latter. In an alternative measuring method according to the present invention, a measuring current is conducted over such a path through the active region, and a Hall voltage is picked up between the first upper contact electrode and the first lower contact surface.

The exemplary embodiments and/or exemplary methods of the present invention are explained below on the basis of specific embodiments and the accompanying figures.

BRIEF DESCRIPTION OF THE DRAWINGS

FIGS. 1B and 1C show cross-sectional views of the Hall sensor element from FIG. 1A along two orthogonal sectional planes.

FIGS. 2A, 2B, and 2C show a top view and the corresponding cross-sectional views of a Hall sensor element according to another specific embodiment.

FIGS. 3A, 3B, and 3C show a top view and the corresponding cross-sectional views of a Hall sensor element according to another specific embodiment.

FIGS. 4A, 4B, and 4C show a schematic top view and the corresponding cross-sectional views of a Hall sensor element according to another specific embodiment.

FIG. 5 shows a sectional perspective view of a Hall sensor element according to another specific embodiment showing wiring for a measuring method according to one specific embodiment.

DETAILED DESCRIPTION

Figure 1A:
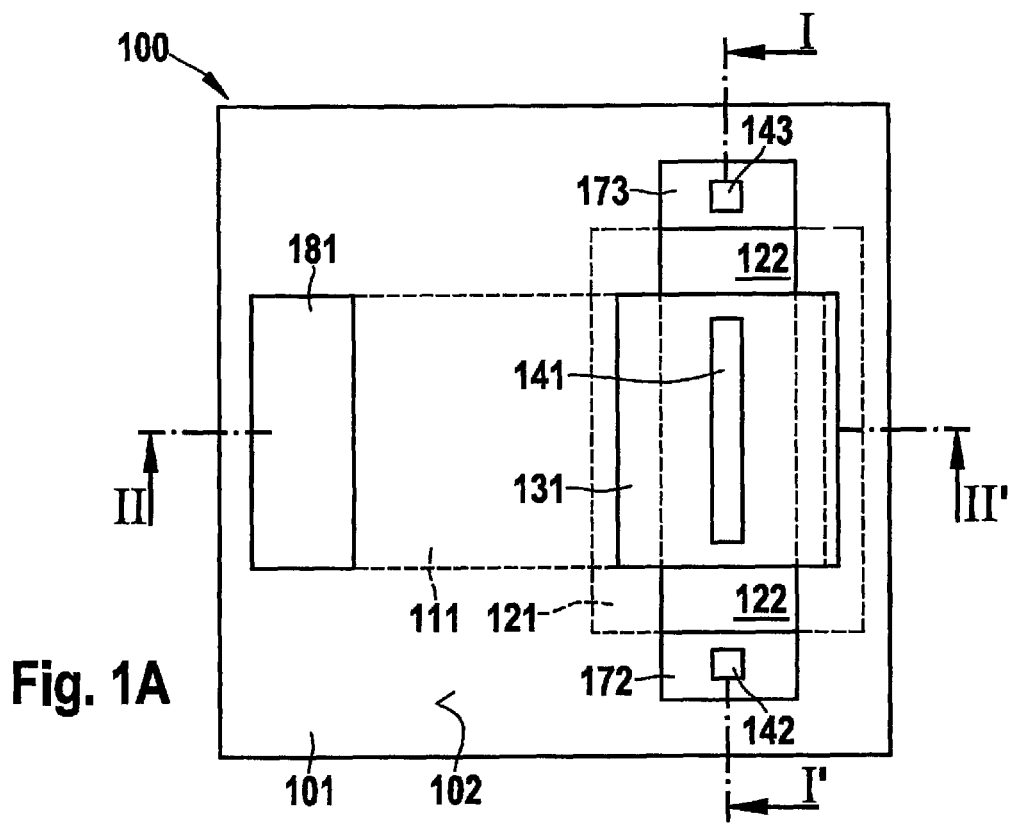
FIG. 1A shows a top view of a Hall sensor element according to one specific embodiment of the present invention.

In the figures, the same reference numerals denote the same or functionally identical components, unless indicated otherwise.

FIG. 1A shows a top view of a Hall sensor element 100, which is embedded in a semiconductor substrate 101, for example, silicon. The direction of view of the observer falls perpendicularly on a main surface 102 of substrate 101 which may form a partial detail of the surface of a microchip. Within the context of producing such a microchip, additional layers of material for covering, packaging, etc., may be applied to main surface 102, but are not shown here. Two dash-dot lines I-I' and II-II' mark sectional planes running perpendicularly to one another and to main surface 102 of substrate 101, the corresponding sectional views thereof being shown in FIG. 1B and FIG. 1C. Dotted lines in FIG. 1A mark contours of elements 111, 121 buried beneath main surface 102, whereas the sectional views in FIGS. 1B-C do not show elements concealed behind the corresponding sectional plane.

Hall sensor element 100 shown here includes an electrically conductive active semiconductor area 131 for recording the Hall effect. Active area 131 extends from main surface 102 into substrate 101 and is doped with a first type of conductivity, p or n. Active area 131 has an elongated shape in direction I-I' in the plane of main surface 102. Substrate 101 is weakly doped with the opposite type of conductivity and has a much lower conductivity than active area 131.

In a plane beneath the lower boundary surface of active area 131, the Hall sensor element has an electrically conductive buried layer 111 of the first type of conductivity, i.e., with a doping of the same type as active area 131. Such a buried layer is readily manufacturable by traditional semiconductor manufacturing methods, e.g., smart power processes. Buried layer 111 electrically contacts the active area at a lower contact surface 191, which extends above a large area of a central section of the lower boundary of active area 131. An electrically insulating frame-type separating structure 121 directly above the upper boundary surface of buried layer 111 forms a defined lateral boundary of lower contact surface 191. In alternative specific embodiments, separating structure 121 may be omitted entirely or partially. Buried layer 111 extends through substrate 101 up to a location at a distance from active area 131, where a conductive contact plug 181 provides an electrical connection of buried layer 111 to an exposed terminal site at main surface 102 of the substrate.

It is emphasized that the distance of contact plug 181 from the active area may be designed to be of different lengths depending on the application, and contact plug structure 181 shown here is given only as an example of a possible manner for providing buried layer 111 with an electrical connection. In alternative specific embodiments, for example, the buried layer may be partially or entirely exposed toward a rear surface opposite main surface 102, so that it is directly contactable from the rear surface or is electrically connected to structures formed on the rear surface. For example, in an alternative specific embodiment, the buried layer may be contacted by a rear contact plug which extends from buried layer 111 to a contact surface or conductive structure on the rear surface.

At the center of the upper boundary surface of active area 131 situated at main surface 102 perpendicularly above lower contact surface 191, a first upper contact electrode 141 also having an elongated shape in direction I-I' is designed as an area of increased doping having the first type of conductivity. On both sides of first upper contact electrode 141, active area 131 extends in direction I-I' beyond separating structure 121, where it is contacted by a second upper contact electrode 142 and a third upper contact electrode 143 at main surface 102. The exact position of optional separating structure 121, which in the present specific embodiment prevents a linear electrical connection between second upper contact electrode 142 and third upper contact electrode 143 on the one hand and lower contact surface 191 on the other hand, may be selected according to the design rules of the semiconductor manufacturing method used to manufacture Hall sensor element 100 in deviation from the present specific embodiment. Second upper contact electrode 142 and third upper contact electrode 143 are also formed as areas of increased doping having the first type of conductivity, where they are each surrounded by a surface contact area 172, 173 of increased doping having the first type of conductivity, this type having the same width as lower contact surface 191 in direction II-II'. Surface contact areas 172, 173 are each separated from the upper boundary surface of active area 131 exposed above lower contact surface 191 by an insulating barrier 122 situated above separating structure 121 in such a way that there is an electrical connection of second upper contact electrode 142 and third upper contract electrode 143 in the section of the active area situated above lower contact surface 191 only between separating structure 121 and barrier 122 situated above it.

During operation of Hall sensor element 100, an operating current source is connected to contact plug 181 and to first upper contact electrode 141, for example, so that an operating current is applied along first connecting line 161 running through active area 131 perpendicularly to main surface 102 between lower contact surface 191 and the first upper contact electrode. When a magnetic field is applied parallel to main surface 102 in direction II-II', a Hall voltage occurs along a second connecting line 104 between surface contact areas 172, 173 belonging to second upper contact electrode 142 and third upper contact electrode 143. With suitable dimensioning of surface contact areas 172, 173, Hall sensor element 100 may also be operated in reverse by applying an operating current via second upper contact electrode 142 and third upper contact electrode 143, and a Hall voltage is picked up at contact plug 181 and first upper contact electrode 141. To increase the precision within the context of a spinning current method, it is possible to switch periodically between the two modes of operation. Magnetic fields running in any directions parallel to the main surface may be measured by two of these Hall sensor elements 100, which are situated on a shared substrate at an angle to one another, for example.

Figure 1B:
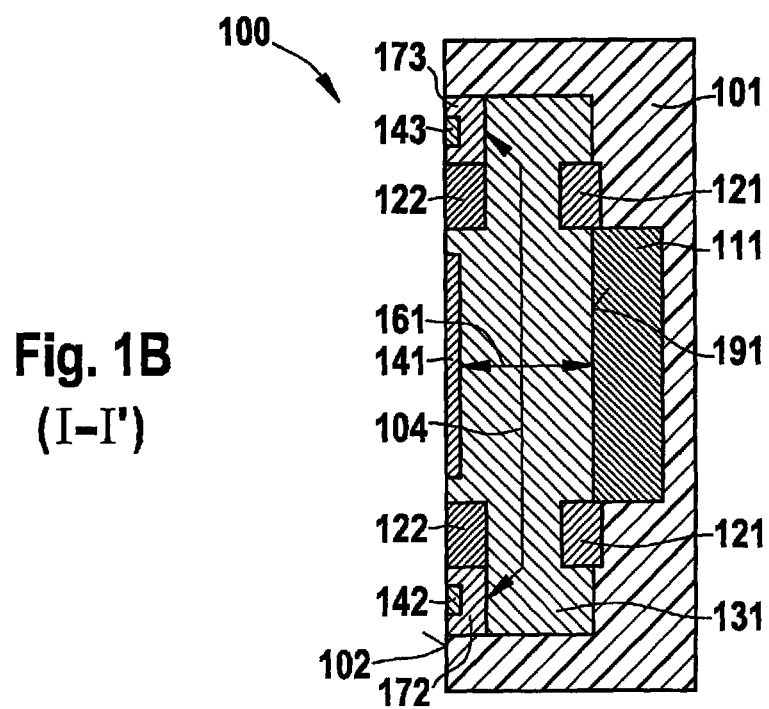

FIGS. 2A-C, FIGS. 3A-C, and FIGS. 4A-C show additional examples of Hall sensor elements 100 according to the same principles of representation as those used for FIGS. 1A-C in groups formed by three figures which belong together. Reference is made to similar valid discussions about FIGS. 1A-C concerning the relationship of top views and sectional views as well as the meaning of the dash-dot lines and dashed lines.

Figure 2B:
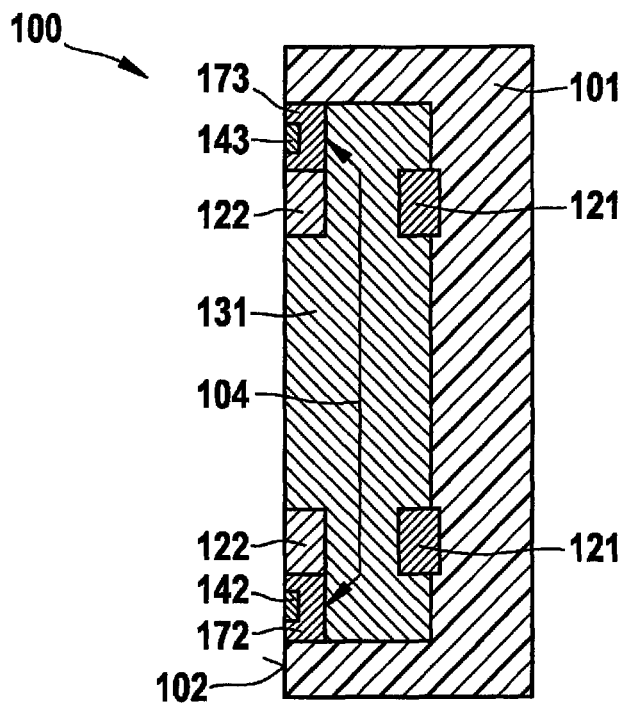
Figure 2C:
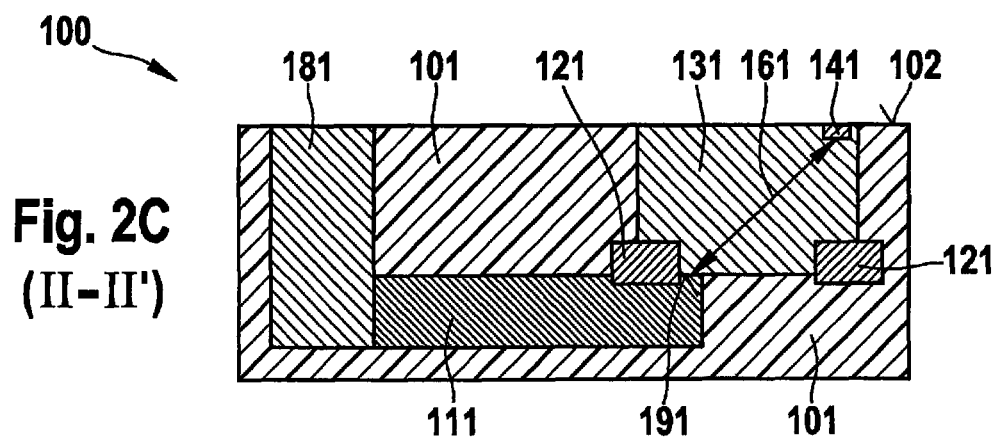

FIGS. 2A-C show a Hall sensor element 100 in which, similarly to Hall sensor element 100 from FIGS. 1A-C, buried layer 111 extends from contact plug 181 beneath separating structure 121, which is likewise optional here, along and up to the lower boundary surface of active area 131, but, as a difference, ends just downstream from separating structure 121 so that lower contact surface 191 of buried layer 111 to active area 131 is formed only along the edge area of the lower boundary surface of active area 131 situated in the direction of the contact plug. In another difference, first upper contact electrode 141 is situated at main surface 102 at the edge of active area 131 diagonally opposite lower contact surface 191, so that first connecting line 161 between lower contact surface 191 and the first upper contact electrode 141 runs diagonally inclined by what may be approximately 45° with respect to main surface 102. By using the diagonals, Hall sensor element 100 shown here has a higher sensitivity for magnetic fields incident obliquely on main surface 102. The structure and operation otherwise correspond to those of Hall sensor element 100 from FIGS. 1A-C.

Figure 3A:
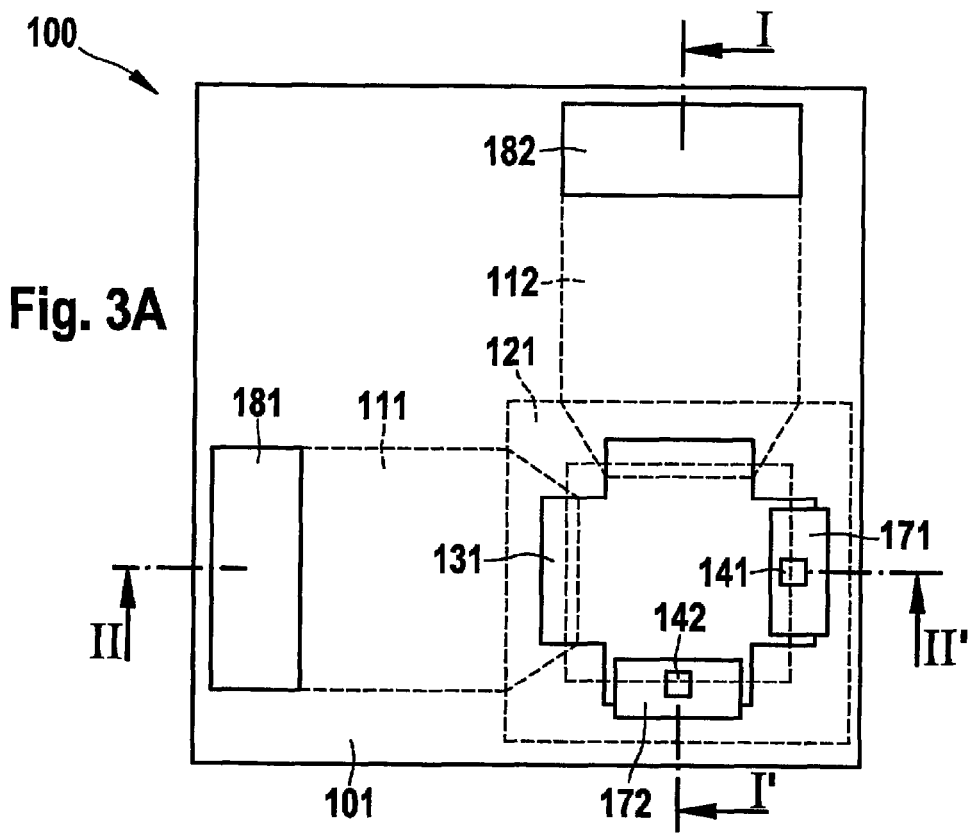
Figure 3B:
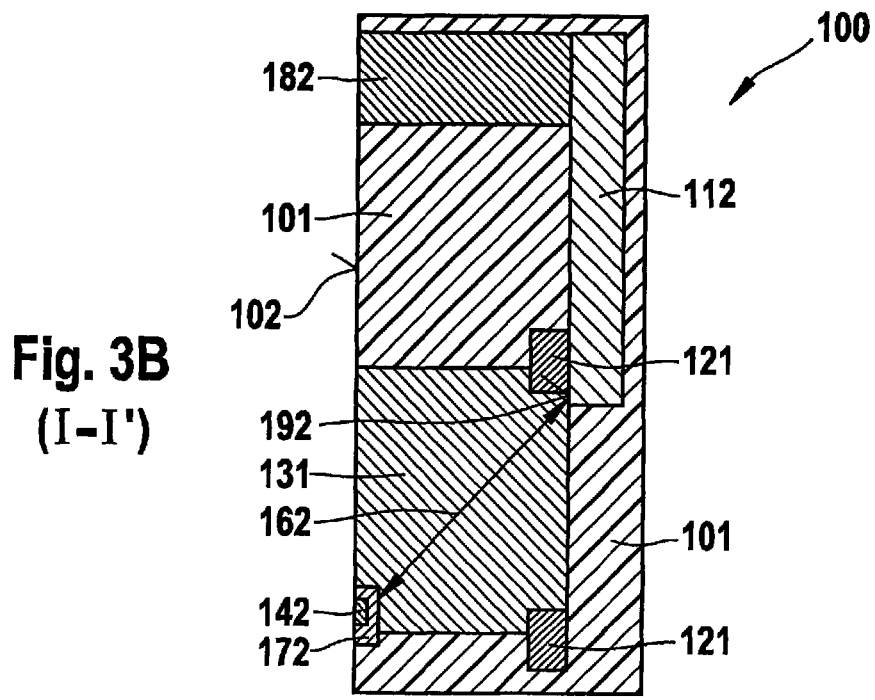

In the case of Hall sensor element 100 shown in FIGS. 3A-C, based on the design of the Hall sensor element shown in FIGS. 2A-C, the third upper contact electrode present there has been replaced here by a second buried layer 112 having a corresponding second contact plug 182 and a second lower contact surface 192 in active area 131. Like first connecting line 161, second connecting line 162 also runs through active area 131 diagonally inclined by what may be 45° with respect to main surface 102. Due to its symmetry, this Hall sensor element 100 is capable of spinning current operation without any additional measures.

Figure 4B:
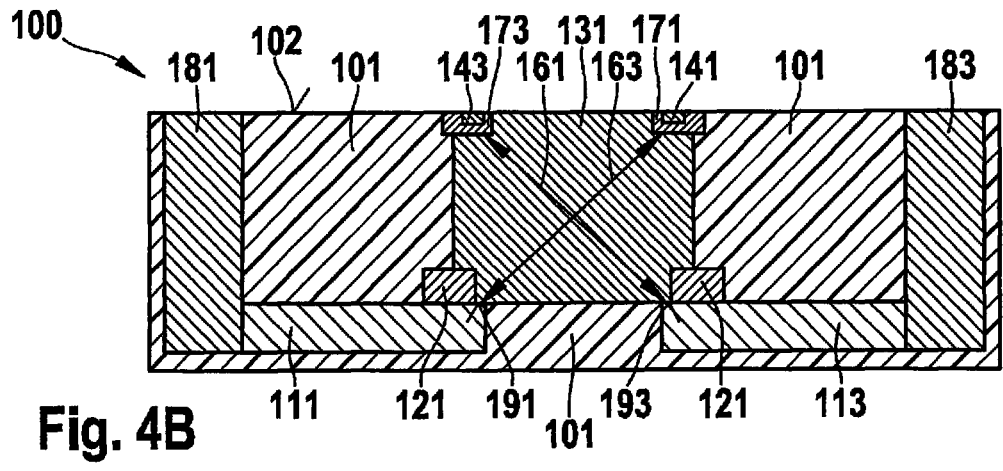
Figure 4C:
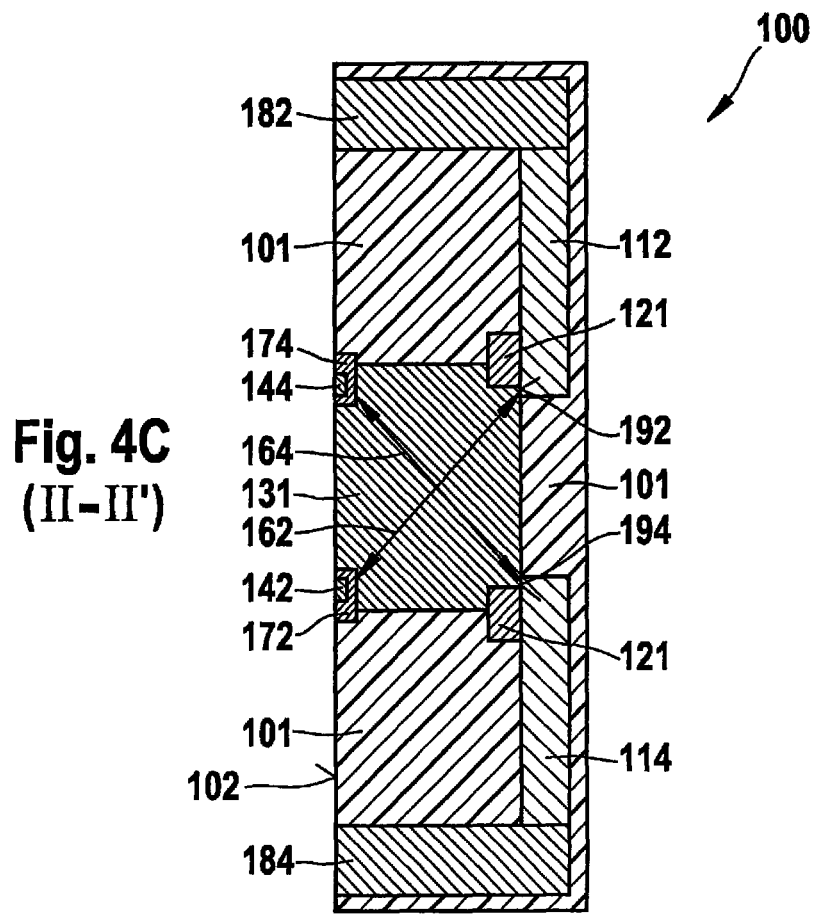

In the case of Hall sensor element 100 shown in FIGS. 4A-C, two Hall sensor structures have been crossed as shown in FIGS. 3A-C, in such a way that four buried layers 111-114, which are electrically connectable via four corresponding contact plugs 181-184, contact active area 131 from four sides at corresponding first through fourth lower contact surfaces 191-194, corresponding first through fourth upper contact electrodes 141-144 having corresponding surface contact areas 171-174 being each formed on the edges, which are diagonally opposite lower contact surfaces 191-194. This yields two Hall sensor structures each capable of spinning current operation, which are sensitive to magnetic fields in different directions and which jointly span a two-dimensional measuring space. Furthermore, four upper contact electrodes 141-144 may be wired like a horizontal Hall sensor element, so that magnetic fields perpendicular to main surface 102 may also be sensed, and spinning current operation is also possible. Magnetic fields in any spatial position may be sensed using just one Hall sensor element 100.

FIG. 5 shows a sectional perspective view of Hall sensor element 100, illustrating clearly how layers 111, 112, which are buried in substrate 102, 500, are covered by a substrate area 500, which is filled after the formation of buried layers 111, 112, and an additional cover layer 502. Furthermore, this shows how a Hall sensor element 100 constructed according to the same principle as the Hall sensor element shown in FIGS. 4A-C may be wired for measuring magnetic fields running perpendicularly to sectional plane 599 and thus parallel to main surface 102, using an operating current source 580 for applying operating current I and a voltmeter 582 for measuring Hall voltage $U_H$.

Figure 6:
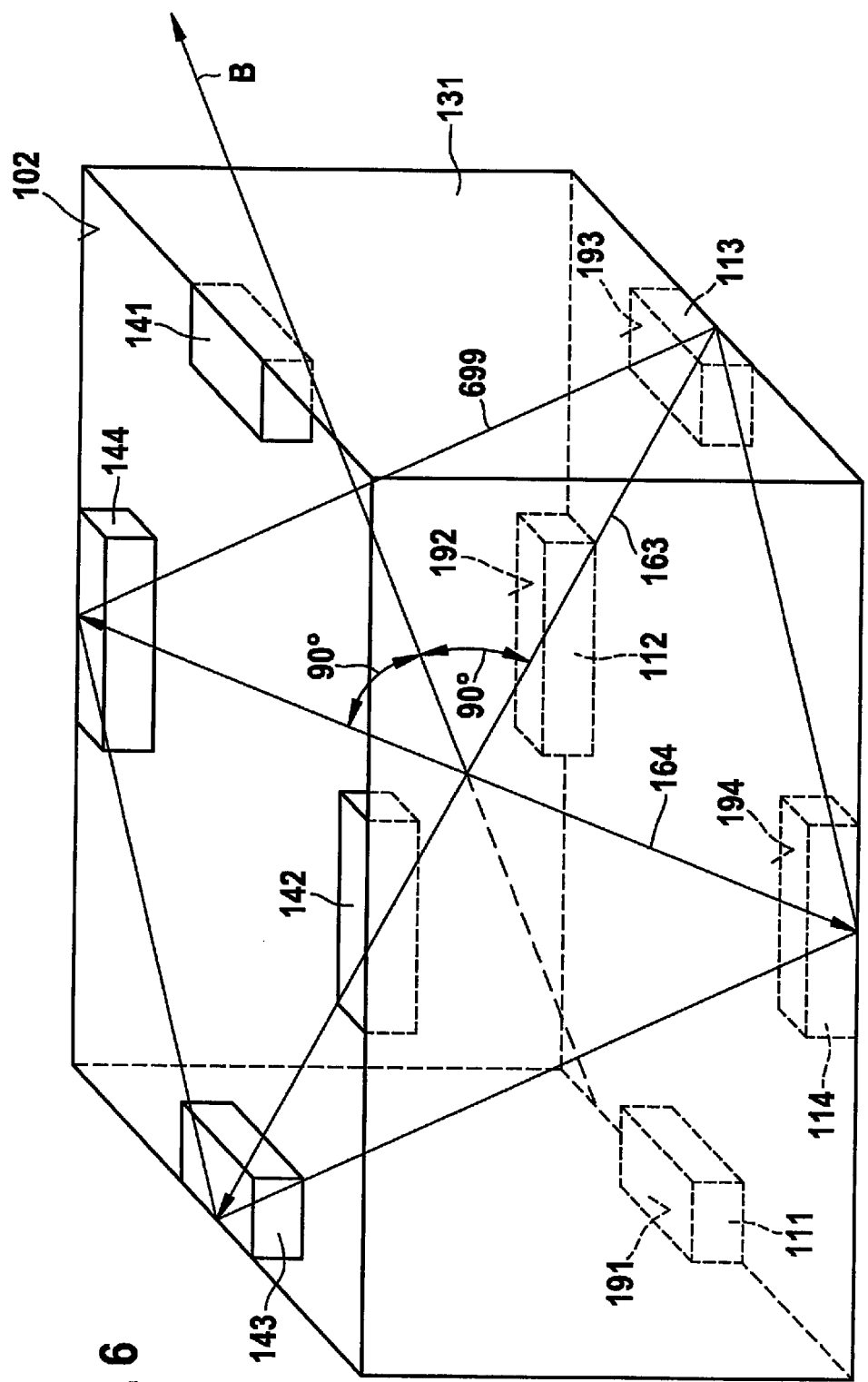
FIG. 6 shows a perspective schematic diagram of a measuring method according to another specific embodiment.

FIG. 6 shows a perspective schematic diagram of a measuring method on a Hall sensor element having a geometric structure like that of the Hall sensor element shown in FIGS. 4A-C. With the momentary wiring shown here, an operating current is applied along a connecting line 163 running diagonally between a lower contact surface 193 and an opposite upper contact electrode 143, while the Hall voltage is picked up along a segment along another connecting line 164, the two connecting lines diverging from one another by a 90° rotation about the vertical axis of symmetry of active area 131. Magnetic field components B running perpendicularly to momentary measuring plane 699 spanned by connecting lines 163, 164 are sensed in this way.

Figure 7:
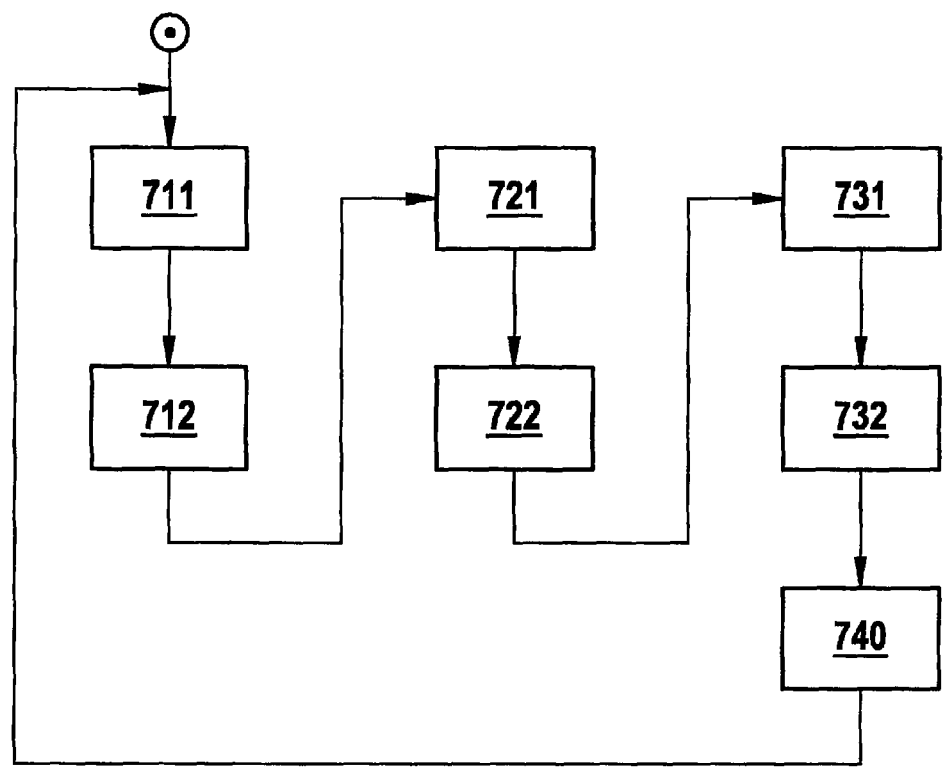
FIG. 7 shows a flow chart of a measuring method according to one specific embodiment.

FIG. 7 shows a flow chart of an exemplary measuring method on a Hall sensor element having a geometric structure like that of the Hall sensor element shown in FIGS. 4A-C, which is to be explained now with reference to FIGS. 6 and 4A-C. In step 711, a first operating current is applied, which flows along a first connecting line 161 between first lower contact surface 191 and first upper contact electrode 141. In step 712, while the applied first operating current is flowing, a first Hall voltage is picked up along a second connecting line 162 between second lower contact surface 192 and second upper contact electrode 142, and from this Hall voltage a component of the magnetic flux density in active area 131 perpendicular to a first measuring plane spanned by first connecting line 161 and second connecting line 162 is determined.

The first operating current ends in step 721 and a second operating current which flows along second connecting line 162 is applied. In step 722, while the second operating current is flowing, a second Hall voltage is picked up along a third connecting line 163 between third lower contact surface 193 and third upper contact electrode 143 and from this Hall voltage a component of the magnetic flux density in active area 131 perpendicular to another measuring plane spanned by second connecting line 162 and third connecting line 163 is determined.

The second operating current ends in step 731 and a third operating current is applied, which flows along an additional connecting line between first upper contact electrode 141 and third upper contact electrode 143. In step 732, while the third operating current is flowing, a third Hall voltage is picked up along yet another connecting line between second upper contact electrode 142 and fourth upper contact electrode 144 and from this Hall voltage, a component of the magnetic flux density in active area 131 perpendicular to a measuring plane running parallel to main surface 102 of the substrate is determined.

In step 740, a vector indicating the strength and direction of the magnetic flux density in active area 131 in a desired coordinate system, e.g., a Cartesian or polar coordinate system, is calculated from the three components of the magnetic flux density determined in steps 712, 722 and 732. The measuring method is then repeated starting at step 711. In the above-mentioned passage as well as in the repetition, the contacts used for applying the operating current and for picking up the Hall voltage of one of the measuring planes may be alternately switched in the manner of a spinning current method and/or the vector of the magnetic flux density may be ascertained from the data acquired in two or more passes.

In the method described here, fourth buried layer 114 shown in FIGS. 4A-C and corresponding elements 144, 174, 184 are not needed. The method may therefore also be executed using a modified Hall sensor element in which these elements are omitted. On the other hand, the method from FIG. 7 may be modified to the extent that measurements in additional measuring planes are performed additionally or alternatively with respect to Hall sensor element 100 from FIGS. 4A-C and FIG. 6, for example, these measurements being performed in measuring planes which are inclined with respect to main surface 102 and are spanned by third connecting line 163 and fourth connecting line 164 or by fourth connecting line 164 and first connecting line 161, and additionally being performed in measuring planes perpendicular to main surface 102 and spanned by first connecting line 161 and third connecting line 163 or by second connecting line 162 and fourth connecting line 164. For three-dimensional measurement of magnetic fields, three measuring planes having linearly independent normal vectors are advantageously selected.

What is claimed is:

1. A Hall sensor element, comprising:
a substrate having a main surface;
an electrically conductive active region extending from the main surface into the substrate;
an electrically conductive first buried layer in the substrate, which contacts the active region at a first lower contact surface;
a first upper contact electrode, which contacts the active region at the main surface;
wherein the first upper contact electrode is situated diagonally offset to the first lower contact surface so that a first operating current flows between the lower contact surface and the first upper contact electrode diagonally inclined with respect to the main surface, along a first connecting line inclined by 45° with respect to the main surface;
a second electrically conductive buried layer, which contacts the active region at a second lower contact surface; and
a second upper contact electrode, which contacts the active region at the main surface;
wherein the first connecting line between the first lower contact surface and the first upper contact electrode runs inclined to a second connecting line between the second lower contact surface and the second upper contact electrode, and wherein the second connecting line is inclined by 45° with respect to the main surface.

2. The Hall sensor element of claim 1, wherein the substrate is a semiconductor substrate, and wherein the region is a semiconductor region of a first type of conductivity.

3. The Hall sensor element of claim 1, further comprising:
a second upper contact electrode and a third upper contact electrode, which contact the active region at the main surface.

4. The Hall sensor element of claim 3, wherein a Hall voltage is applied when a magnetic field is applied to the Hall sensor element between the second upper contact electrode and the third upper contact electrode.

5. The Hall sensor element of claim 1, further comprising:
a third electrically conductive buried layer and a fourth electrically conductive buried layer, which contact the active region at a corresponding third lower contact surface and a fourth lower contact surface; and
a third upper contact electrode and a fourth upper contact electrode, which contact the active region at the main surface.

6. The Hall sensor element of claim 5, wherein when a magnetic field is applied to the Hall sensor element and a second operating current is applied between the second buried layer and the second upper contact electrode, a second Hall voltage can be picked up between the lower contact surface and the third upper contact electrode.

7. A Hall sensor element, for multidimensional or three-dimensional measurement of a magnetic field, comprising:
a substrate having a main surface;
an electrically conductive active region extending from the main surface into the substrate;
an electrically conductive first buried layer in the substrate, which contacts the active region at a first lower contact surface; and
a first upper contact electrode, which contacts the active region at the main surface;
wherein the first upper contact electrode is situated diagonally offset to the first lower contact surface so that a first operating current flows between the lower contact surface and the first upper contact electrode diagonally inclined with respect to the main surface, along a first connecting line inclined by 45° with respect to the main surface;
a second electrically conductive buried layer, which contacts the active region at a second lower contact surface; and
a second upper contact electrode, which contacts the active region at the main surface;
wherein the first connecting line between the first lower contact surface and the first upper contact electrode runs inclined to a second connecting line between the second lower contact surface and the second upper contact electrode, and wherein the second connecting line is inclined by 45° with respect to the main surface.

8. A method for measuring a magnetic field with the aid of a Hall sensor element, the method comprising:
conducting an electrical measuring current between a first upper contact electrode and a first lower contact surface, which is diagonally offset to the first upper contact electrode along a first connecting line through the active region which is inclined by 45° with respect to the main surface; and
picking up a Hall voltage in the active region along a second connecting line between a second lower contact surface and a second upper contact electrode, which runs inclined to the first connecting line between the first lower contact surface and the first upper contact electrode;
wherein the Hall sensor element includes:
a substrate having the main surface;
an electrically conductive active region extending from the main surface into the substrate;
electrically conductive first and second buried layers in the substrate, which contact the active region at respective first and second lower contact surfaces; and
the first and second upper contact electrodes, which contact the active region at the main surface.

9. A method for measuring a magnetic field with the aid of a Hall sensor element, the method comprising:
conducting an electrical measuring current through the active region over a path which runs inclined to a first connecting line between a first lower contact surface and a first upper contact electrode along a second connecting line between a second lower contact surface and a second upper contact electrode, which is inclined by 45° with respect to the main surface; and
picking up a Hall voltage between the first upper contact electrode and the first lower contact surface;
wherein the Hall sensor element includes:
a substrate having the main surface;
an electrically conductive active region extending from the main surface into the substrate;
electrically conductive first and second buried layers in the substrate, which contact the active region at respective first and second lower contact surfaces; and
the first and second upper contact electrodes, which contact the active region at the main surface.

10. A method for measuring a magnetic field with the aid of a Hall sensor element, the method comprising:
conducting an electrical measuring current between a first upper contact electrode and a first lower contact surface, which is diagonally offset to the first upper contact electrode along a first connecting line through the active region which is inclined by 45° with respect to the main surface;

picking up a Hall voltage in the active region along a second connecting line between a second lower contact surface and a second upper contact electrode, which runs inclined to the first connecting line between the first lower contact surface and the first upper contact electrode and which is inclined by 45° with respect to the main surface;

ascertaining a component of the magnetic flux density in the active region perpendicular to a first measuring plane that is spanned by the first and second connecting lines;

conducting an electrical measuring current through the active region over the second connecting line;

picking up a Hall voltage along a third connecting line between a third lower contact surface and a third upper contact electrode;

ascertaining a component of the magnetic flux density in the active region perpendicular to a measuring plane that is spanned by the second and third connecting lines;

conducting an electrical measuring current through the active region over a fourth connecting line between the first and the third upper contact electrode;

picking up a Hall voltage between the second upper contact electrode and a fourth upper contact electrode;

ascertaining a component of the magnetic flux density in the active region perpendicular to a measuring plane that runs parallel to the main surface of the substrate; and calculating a vector that indicates the magnitude and the direction of the magnetic flux density in the active region from the three ascertained components of the magnetic flux density;

wherein the Hall sensor element includes:
  a substrate having the main surface;
  first, second, third and fourth electrically conductive buried layers which contact the active region at respective first, second, third and fourth lower contact surfaces; and
  first, second, third and fourth upper contact electrodes, which contact the active region at the main surface.

11. A method for the three-dimensional measurement of a magnetic field with the aid of a Hall sensor element, the method comprising:
  in each of at least two iterations:
    conducting an electrical measuring current through the active region between a first upper contact electrode and a first lower contact surface which is diagonally offset to the first upper contact electrode, along a first connecting line, which is inclined by 45° with respect to a main surface;
    picking up a Hall voltage in the active region along a second connecting line which runs inclined to the first connecting line; and
    ascertaining a respective component of the magnetic flux density in the active region perpendicular to a respective measuring plane that is spanned by the first and the second connecting line, wherein the respective measuring planes used for the respective iterations are selected such that normal vectors of the respective measuring planes are linearly independent of each other.

12. The method of claim 11, wherein the at least two iterations include at least three iterations, and the measuring planes selected for the three iterations are selected such that normal vectors of the respective measuring planes of the three iterations are linearly independent of each other.

* * * * *